US006892781B2

(12) United States Patent
McHerron et al.

(10) Patent No.: US 6,892,781 B2
(45) Date of Patent: May 17, 2005

(54) METHOD AND APPARATUS FOR APPLICATION OF PRESSURE TO A WORKPIECE BY THERMAL EXPANSION

(75) Inventors: Dale C McHerron, Staatsburg, NY (US); Kaushal S. Patel, Wappingers Falls, NY (US); Christopher Lee Tessler, Campbell Hall, NY (US); Jerry A. Gorrell, LaGrangeville, NY (US); James Edward Tersigni, Castleton, NY (US)

(73) Assignee: International Business Machines Corporation, Armonk, NY (US)

(*) Notice: Subject to any disclaimer, the term of this patent is extended or adjusted under 35 U.S.C. 154(b) by 348 days.

(21) Appl. No.: 10/156,895

(22) Filed: May 28, 2002

(65) Prior Publication Data

US 2003/0221777 A1 Dec. 4, 2003

(51) Int. Cl.[7] .............................................. B32B 31/00
(52) U.S. Cl. ........................ 156/580; 156/499; 156/537; 228/193
(58) Field of Search ................. 156/499, 537, 156/580, 308.2; 228/193

(56) References Cited

U.S. PATENT DOCUMENTS 3,413,532 A * 11/1968 Boyer .......................... 257/688
3,972,755 A 8/1976 Misfeldt
4,252,263 A * 2/1981 Houston ....................... 228/193
4,806,195 A 2/1989 Namysl
5,570,504 A 11/1996 DiStefano et al.
5,640,761 A 6/1997 DiStefano et al.
5,688,350 A 11/1997 Hamilton et al.
6,036,809 A 3/2000 Kelly et al.

FOREIGN PATENT DOCUMENTS

EP           0280112 A    *  8/1988
JP           53-103539        6/1980
JP           63-120659 A   *  5/1988
WO        WO-99/67819 A1 * 12/1999

* cited by examiner

*Primary Examiner*—Jeff H. Aftergut
(74) *Attorney, Agent, or Firm*—Ira D. Blecker

(57) ABSTRACT

A fixture having a bottom plate, top plate and an expansion block interposed between the bottom plate and top plate. A workpiece is positioned between the expansion block and bottom plate. When the fixture is heated, there is a net displacement exerted by the expansion block so as to apply pressure to the workpiece. The pressure applied by the fixture to the workpiece is due solely to the thermal expansion of the fixture when it is heated.

12 Claims, 3 Drawing Sheets

METHOD AND APPARATUS FOR APPLICATION OF PRESSURE TO A WORKPIECE BY THERMAL EXPANSION

BACKGROUND OF THE INVENTION

The present invention relates generally to the application of pressure to a workpiece and, more particularly, relates to the application of pressure to a workpiece solely by thermal expansion of the fixture holding the workpiece.

Increasing demands are emerging for higher performance semiconductor packages. To meet these demands, interconnection designs have been proposed using thin film technology, including multilayer thin film (MLTF) structures.

MLTF structures are composed of metal and dielectric layers comprising, among other materials, copper and polyimide. Such structures are used in the microelectronics industry to interconnect semiconductor devices (also referred to as chips). The interconnect structure includes alternating layers of electrically insulating and conducting materials. Vias in the insulating material provide electrical connections between the conductor layers and bond pad terminations on semiconductor devices. The number of conductor layers depends on the signal routing, grounding and shielding requirements for the interconnect structure.

Thin film structures can be fabricated in a variety of ways. In one method, the thin film structure is fabricated on a temporary substrate such as one made from silicon, ceramic, glass or polished metals. Once the thin film structure is complete, it is removed from the temporary substrate and then typically joined or laminated to a permanent substrate by the application of heat and pressure in a lamination press. The formation of such thin film structures and their joining to a permanent substrate is disclosed in Kelly et al. U.S. Pat. No. 6,036,809, the disclosure of which is incorporated by reference herein. The permanent substrate may also be selected from the same group of materials that are used for the temporary substrate.

Heretofore, the lamination of the thin film structure to the permanent substrate has been accomplished by hydraulic or pneumatic means. Hydraulic or pneumatic means for applying pressure in related applications, such as printed circuit board laminating, have been proposed by others such as Namysl U.S. Pat. No. 4,806,195, the disclosure of which is incorporated by reference herein. Numerous other references disclose printed circuit board laminating by the application of heat and pressure without disclosing the precise apparatus. Examples of the latter include DiStefano et al. U.S. Pat. No. 5,640,761, DiStefano et al. U.S. Pat. No. 5,570,504, Hamilton et al. U.S. Pat. No. 5,688,350, and Misfeldt U.S. Pat. No. 3,972,755, the disclosures of which are incorporated by reference herein.

Japanese Published Patent Application 55-031819, the disclosure of which is incorporated by reference herein, discloses a laminating apparatus including Teflon® "resin plates" in which the laminating pressure is applied by a pressing plate and a screw or bolt.

The typical apparatus for the application of heat and pressure to a workpiece, whether it is lamination as described above or some other application, has several deficiencies. The first is the typical apparatus is run in batch operation which restricts throughput. Another deficiency is that the typical apparatus requires large capital expenditures. A further deficiency is large capital expenditures to maintain sufficient tools to meet capacity needs. A last deficiency is the high operating costs associated with the operating and maintenance of the typical apparatus.

In view of the foregoing, it is a purpose of the present invention to have an apparatus and method for the application of heat and pressure that can be run in batch mode or continuous mode to optimize the throughput of the apparatus.

It is another purpose of the present invention to have an apparatus and method for the application of heat and pressure that substantially reduces capital expenditures for the tool itself as well as the number of tools to meet capacity requirements.

It is yet another purpose of the present invention to have an apparatus and method for the application of heat and pressure that has reduced operating costs.

These and other purposes of the present invention will become more apparent after referring to the following description of the invention considered in conjunction with the accompanying drawings.

BRIEF SUMMARY OF THE INVENTION

The purposes of the invention have been achieved by providing according to a first aspect of the present invention a fixture for applying heat and pressure to a workpiece comprising:

a bottom plate forming the base of the fixture;

an expansion block opposed to the bottom plate and comprising a first material having a first coefficient of thermal expansion, CTE1;

a top plate opposed to the expansion block and forming the top of the fixture;

an alignment means aligning the bottom plate and second plate and comprising a second material having a second coefficient of thermal expansion, CTE2;

a pressure means spacing the expansion block and top plate a fixed distance apart at room temperature, the pressure means comprising a third material having a third coefficient of thermal expansion, CTE3; and wherein, in operation, a workpiece is placed between the bottom plate and expansion block and pressure is applied to the workpiece by the pressure means on the expansion block to keep the workpiece from moving wherein the bottom plate is separated from the expansion block by a gap, the workpiece and fixture are then placed in an oven heated to a predetermined temperature, the heat causing the expansion block, alignment means and pressure means to expand with a net displacement so as to change the gap to thereby cause pressure to be applied to the workpiece while being heated.

According to a second aspect of the invention, there is provided a method for applying heat and pressure to a workpiece comprising the steps of:

placing the workpiece between a pressure plate and an expansion block of a fixture;

placing the workpiece and fixture in an oven at a predetermined temperature, the heat causing the fixture to expand predominantly in a direction that causes a gap between the pressure plate and expansion block to change, thereby applying pressure to the workpiece; and removing the workpiece and fixture from the oven and cooling to room temperature.

According to a third aspect of the present invention, there is provided a method for applying heat and pressure to a workpiece comprising the steps of:

placing the workpiece between a pressure plate and an expansion block of a fixture, the fixture further comprising a pressure means for exerting a force on the expansion block;

placing the workpiece and fixture in an oven at a predetermined temperature, the heat causing the fixture to expand predominantly in a direction that causes a gap between the pressure plate and expansion block to change, thereby applying pressure to the workpiece, the pressure means capping the pressure applied to the workpiece; and removing the workpiece and fixture from the oven and cooling to room temperature.

DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
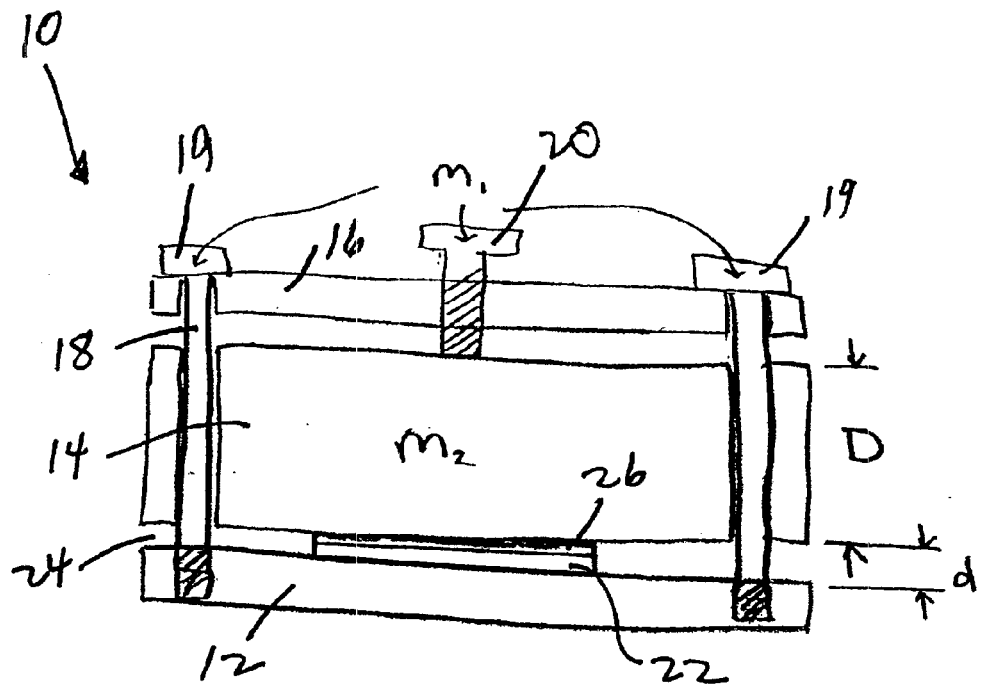
FIG. 1 is a partial cross-sectional view of a first embodiment of a fixture according to the present invention for applying pressure to a workpiece by thermal expansion.

Referring to the Figures in more detail, and particularly referring to FIG. 1, there is shown a fixture 10 according to the present invention for applying heat and pressure to a workpiece 22. The fixture 10 includes a bottom plate 12 which forms the base of the fixture 10, a top plate 16 forming the top of the fixture 10, and an expansion block 14 interposed between the bottom plate 12 and top plate 16. The fixture 10 further comprises alignment means 18 for aligning the top plate 16 and bottom plate 12 with respect to each other. Preferably, the expansion block 14 is also aligned with the top plate 16 and bottom plate 12 by alignment means 18. In one preferred embodiment, alignment means 18 comprises at least two bolts, screws or similar fastening devices as shown in FIG. 1. The fastening device 18 is threaded into bottom plate 12 but is not threaded into expansion block 14 and top plate 16. In this manner, expansion block 14 and top plate 16 are captured between the head 19 of fastening device 18 and bottom plate 12 but may also move vertically on fastening device 18. The fixture 10 further comprises a pressure means which spaces the top plate 16 from expansion block 14. In one preferred embodiment as shown in FIG. 1, the pressure means 20 is a bolt, screw or similar fastening device which is threaded into top plate 16.

In operation, the workpiece 22 is placed between the bottom plate 12 and expansion block 14 and just enough pressure is applied to the workpiece 22 by the pressure means 20 on the expansion block 14 to keep the workpiece 22 from moving. As can be seen from FIG. 1, the expansion block 14 and bottom plate 12 are separated by a gap 24. Thereafter, the fixture 10 and workpiece 22 (while held in the fixture 10) are then placed in an oven (not shown). The temperature of the oven will be chosen based on the materials of the workpiece 22 and the operation (e.g., laminating) that is to be performed on the workpiece. For a most efficient operation, the oven will be an oven suitable for continuous flow of fixtures 10 and workpieces 22 such as a belt furnace and will be preheated to the desired temperature. However, in batch operation, the oven may be heated once the fixture 10 and workpiece 22 are placed in the oven. The heat in conjunction with the thermal expansion of the fixture 10 causes substantial pressure to be applied to the workpiece 22 to fulfill the desired operation on the workpiece 22.

It must be emphasized that whatever pressure is developed on the workpiece 22 is developed solely as a result of the thermal expansion of the fixture 10. A theoretical treatment of the thermal expansion of the stack follows.

The thermal expansion of an article is determined by multiplying its length times its coefficient of thermal expansion (CTE($\alpha$)) times the temperature. Assume that the fixture is much stronger than the workpiece 22 that is to be compressed. It is preferred in one embodiment of the invention that alignment means 18 and pressure means 20 are made of the same material $M_1$ having a CTE of $\alpha_1$. With the alignment means 18 and pressure means 20 made of the same material $M_1$, it can be seen that any upward thermal expansion above expansion block 14 by alignment means 18 is offset by downward thermal expansion of pressure means 20. Expansion block 14 is made of a second material $M_2$ having a CTE of $\alpha 2$. Thus, it is only necessary to be concerned with the opposite thermal expansions of expansion block 14 and alignment means 18 over the length D of the expansion block 14 to determine the change in the gap 24 over the temperature range during which thermal expansion is to occur. Put mathematically $$d(T_1)-d(T2) \approx D\alpha 2(T_2-T1)-D\alpha_1(T2-T_1) \quad (1)$$

The strain on the workpiece can be expressed as $$\epsilon = (d(T1)-d(T2))/d_1 \quad (2)$$

Then, combining equations (1) and (2) results in the strain on the workpiece being expressed as $$\epsilon \approx (D\alpha 2(T2-T1)-D\alpha_1(T2-T1))/d_1 \quad (3)$$

Equation (3) implies that the strain on the workpiece induced by heating the fixture 10 is basically a function of geometry, the difference in CTE of $M_1$ and $M_2$ and the change in temperature overwhich the thermal expansion occurs. Moreover, the induced strain is independent of the materials that make up the workpiece, again assuming that $M_1$ and $M_2$ are stronger than the workpiece. Accordingly, the present invention can be used regardless of the workpiece material. Further, because the strain $\epsilon$ can be defined as a simple function of temperature for a given fixture, a process engineer only has to understand the effective modulus of the workpiece as a function of temperature to obtain a stress versus temperature curve for the workpiece. Understanding this stress versus temperature curve enables the process engineer to properly determine the correct amount of stress to be imposed on the workpiece to perform the desired operation.

As noted above, it was assumed that the fixture is much stronger than the workpiece 22 that is to be compressed. This would certainly be the case for the preferred MLTF structure described previously. In this situation, the gap 24 will decrease during thermal expansion of the fixture 10 over the predetermined temperature range. In another preferred embodiment of the present invention, the workpiece can be relatively thick and its modulus sufficiently large such that the workpiece 22 is stronger than the fixture 10. In this preferred embodiment, the gap 24 will increase during thermal expansion of the fixture 10 over the predetermined temperature range. Even in this latter embodiment, whatever pressure the fixture 10 develops on the workpiece 22 is developed solely as a result of the thermal expansion of the fixture 10.

There is no practical limitation to the materials that can be used for $M_1$ and $M_2$. $M_1$ may be, for example, a metal selected from the group consisting of titanium, tungsten, molybdenum, alloys of the foregoing and Invar (an Fe/Ni low expansion alloy). $M_2$ may also be, for example, a metal selected from the group consisting of aluminum, copper, nickel, alloys of the foregoing, brass and bronze. Generally speaking, $M_1$ should be a relatively low CTE material while $M_2$ should be a relatively high expansion material. In any event, the CTE of $M_2$ should be equal to or greater than the CTE of $M_1$ in order to develop the appropriate stress and strain on the workpiece.

Returning now to FIG. 1, it is preferred that the fixture 10 further comprise a shim 26 which is interposed between the workpiece 22 and expansion block 14. The shim 26 may be made from many low modulus materials but some preferred materials are fluoropolymers such as Teflon® (approximately 2–4 mils thick) or Kapton® (approximately 1 mil thick) (both available from E. I. DuPont de Nemours, Wilmington, Del.) or a thin aluminum sheet (approximately 1 mm. thick).

Figure 2:
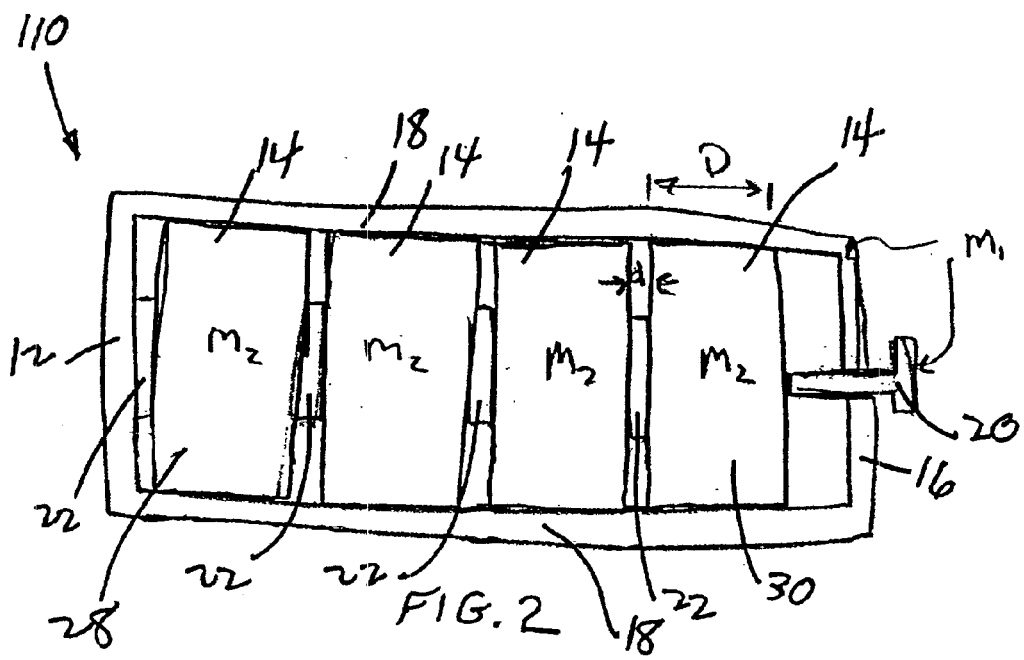
FIG. 2 is a partial cross-sectional view of the fixture of FIG. 1 modified to hold multiple workpieces.

Referring now to FIG. 2, the fixture 10 of FIG. 1 has been modified to form fixture 1 10 which is adapted to hold additional expansion blocks 14. As can be seen from FIG. 2, there are now four expansion blocks 14 but there can be more or less than four depending on the need. There is a workpiece 22 between the first expansion block 28 and the bottom plate 12 and then additional workpieces 22 between the remaining expansion blocks 14. In FIG. 1, the bottom plate 12, top plate 16 and alignment means 18 were all separate articles. In FIG. 2, bottom plate 12, top plate 16 and alignment means 18 form the sides of a frame which holds the expansion blocks 14 and workpieces 22. Spacing the last expansion block 30 from the top plate 16 is a pressure means 20, which preferably is similar to the fastening device described with respect to FIG. 1.

Figure 3:
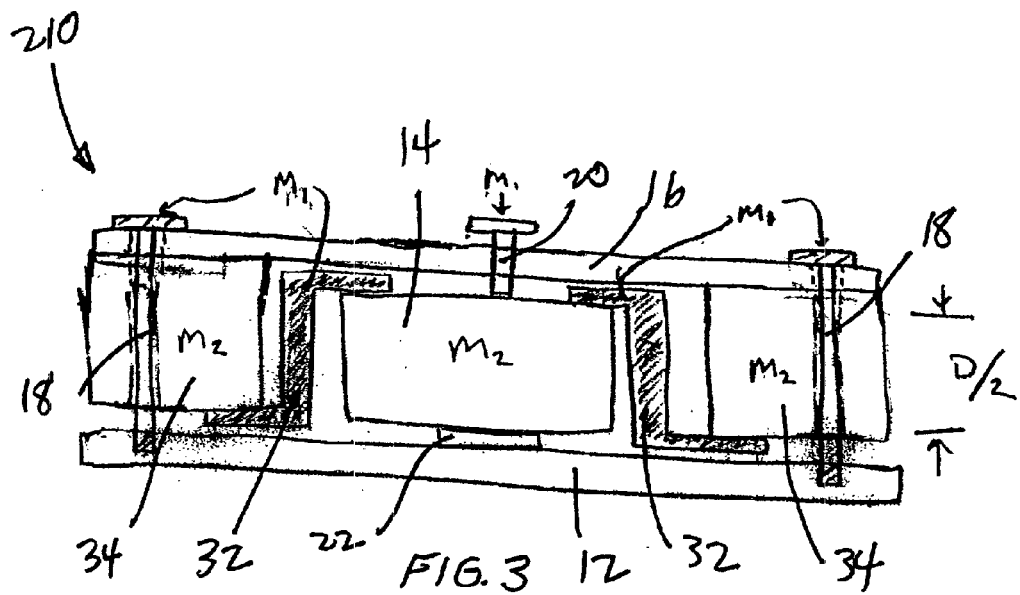
FIG. 3 is a partial cross-sectional view of the fixture of FIG. 1 modified to apply pressure to a workpiece with less space requirements.

Referring now to FIG. 3, the fixture 10 of FIG. 1 has been modified to form fixture 210 which is adapted to displace a workpiece the same distance as fixture 10 but with half the height. Such a fixture might be advantageous where there is limited height available in the oven. As shown in FIG. 3, expansion block 14 is situated between top plate 16 and bottom plate 12 with pressure means 20 spacing the expansion block 14 from top plate 16. Workpiece 22 is positioned between expansion block 14 and bottom plate 12. Additional expansion blocks 34 are positioned on either side of expansion block 14 and between top plate 16 and bottom plate 12. Alignment means 18, preferably a fastening means which passes through expansion blocks 34 and is threaded into bottom plate 12, keep all the component parts of fixture 210 aligned. In operation, fixture 210 is placed in an oven with workpiece 22 in place. The displacement of expansion blocks 34 due to thermal expansion is transferred by displacement transfer means 32 to expansion block 14. Expansion block 14 similarly undergoes displacement due to thermal expansion over the same temperature range. When the displacements due to thermal expansion of expansion blocks 34 and expansion block 14 are added up, the total displacement on workpiece 22 in fixture 210 is similar to the displacement on workpiece 22 due to thermal expansion in fixture 10 but with only about half the height.

Figure 4:
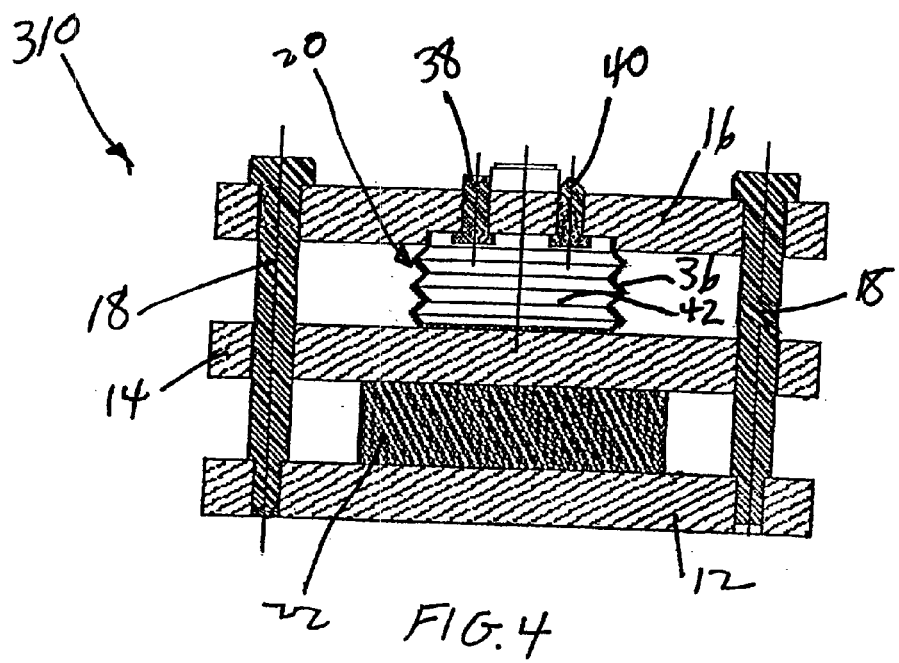
FIG. 4 is a partial cross-sectional view of the fixture of FIG. 1 modified to show a different pressure means.

Referring now to FIG. 4, the fixture 10 of FIG. 1 has been modified to form fixture 310. The main difference between the two fixtures is that the pressure means 20 has been changed. Pressure means 20 now comprises a bellows 36 filled with a fluid 42 which may be a liquid or gas, an inlet valve 38 and a pressure relief valve 40. Fluid 42, particularly if it is a gas, has a thermal expansion much higher than that of alignment means 18. Then, the thermal expansion of pressure means 20 (upon suitable heating such as in an oven) cooperates with expansion block 14 to exert the gas or liquid on workpiece 22. Pressure relief valve 40 may be set such that if a predetermined pressure threshold is reached in the pressure means 20, any excess pressure from the pressure means 20 is relieved by the opening of pressure relief valve 40 so that excess pressure is not applied to the workpiece 22.

Figure 5:
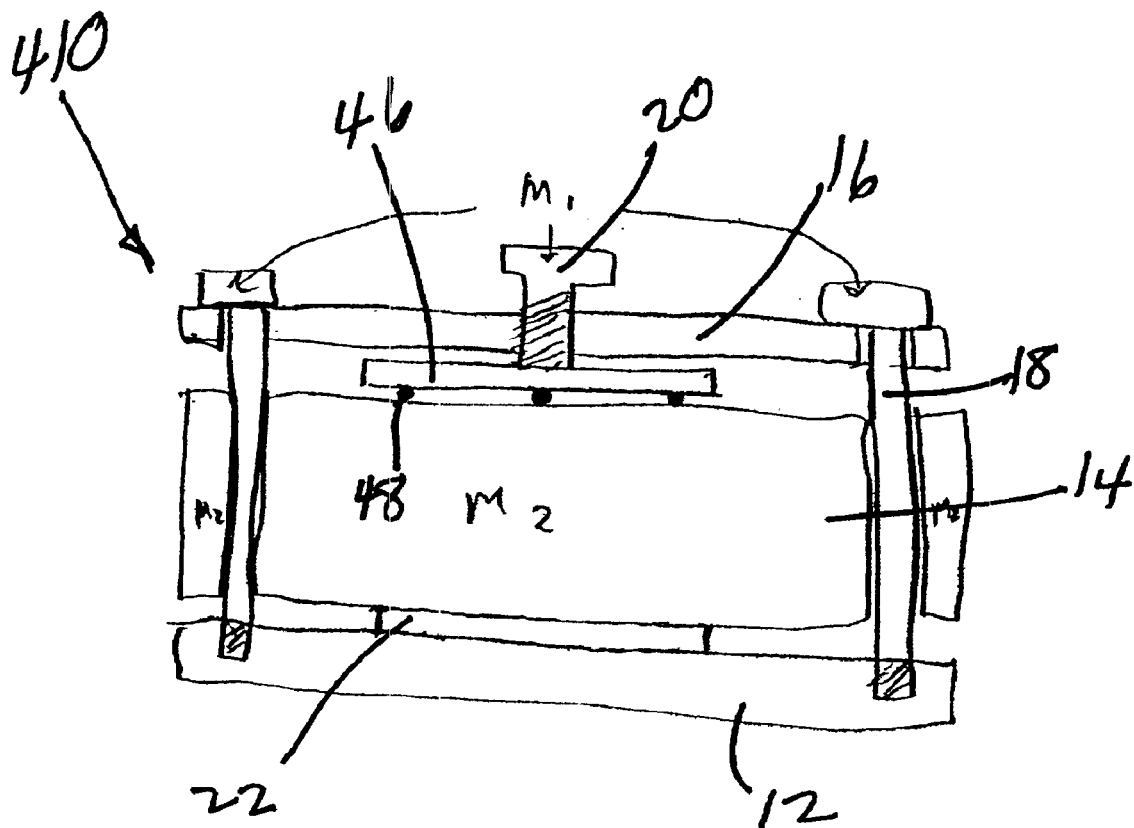
FIG. 5 is a partial cross-sectional view of the fixture of FIG. 1 modified to show a force spreader in conjunction with the pressure means.

Referring now to FIG. 5, the fixture 10 of FIG. 1 has been modified to form fixture 410 which now has a force spreader 46 to spread out the pressure exerted by pressure means 20. If desired, the force spreader 46 may further include protrusions 48.

Throughout the above discussion, the displacement on the workpiece due to the thermal expansion of the fixture has been referred to. Such displacement is on the order of –0.02 inches (gap decreases) to +0.02 inches (gap increases) but could be lower or higher depending on the fixture dimensions, fixture material properties, workpiece dimensions, workpiece material properties and temperature change over which the thermal expansion occurs. While such displacement may seem small, it is nevertheless sufficient to perform many physical operations such as laminating a thin film to a substrate according to one preferred use of the present invention.

It should be apparent that in the previous embodiments, the CTE of the expansion block will be greater than the CTE of the alignment means. In this way, there will be a net displacement due to thermal expansion in the direction of applying pressure to the workpiece. It should further be apparent that in the previous embodiments, the CTE of the pressure means should be approximately equal to or greater than the CTE of the alignment means. For most of the embodiments, the CTE of the pressure means should preferably be equal to the CTE of the alignment means and, further, be made of the same material. However, in the embodiment shown in FIG. 4, the CTE of the pressure means is greater than the CTE of the alignment means. Further with respect to the embodiment shown in FIG. 4, the CTE of the pressure means may be more or less than that of the expansion block since the net displacement in either event will be to apply pressure to the workpiece.

Workpiece 22 is preferably the MLTF structure alluded to earlier. However, workpiece 22 could also be any workpiece that is desired to be pressured or compressed.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A fixture for applying heat and pressure to a workpiece comprising:
   a bottom plate forming the base of the fixture;
   an expansion block opposed to the bottom plate and comprising a first material having a first coefficient of thermal expansion, CTE1;
   a top plate opposed to the expansion block and forming the top of the fixture;
   an alignment means aligning the bottom plate and second plate and comprising a second material having a second coefficient of thermal expansion, CTE2, wherein the alignment means comprises two posts between the top plate and bottom plate, the alignment posts loosely passing through the expansion block;
   a pressure means spacing the expansion block and top plate a fixed distance apart at room temperature, the pressure means comprising a third material having a third coefficient of thermal expansion, CTE3; and
   wherein, in operation, a workpiece is placed between the bottom plate and expansion block and pressure is applied to the workpiece by the pressure means on the expansion block to keep the workpiece from moving wherein the bottom plate is separated from the expansion block by a gap, the workpiece and fixture are then placed in an oven heated to a predetermined temperature, the heat causing the expansion block, alignment means and pressure means to expand with a net displacement so as to change the gap to thereby cause pressure to be applied to the workpiece while being heated.

2. The fixture of claim 1 further comprising a shim placed between the workpiece and the bottom plate or the expansion block.

3. The fixture of claim 2 wherein the shim comprises a material selected from the group consisting of Teflon, Kapton and aluminum.

4. The fixture of claim 1 further comprising at least one additional expansion block such that there are at least two adjacent expansion blocks positioned between the pressure means and the bottom plate wherein, in operation, at least a second workpiece is placed between the adjacent expansion blocks.

5. The fixture of claim 1 wherein the alignment means comprises two posts between the top plate and bottom plate.

6. The fixture of claim 1 further comprising a force spreader situated between the pressure means and the expansion block, the force spreader distributing a force generated by the pressure means.

7. The fixture of claim 1 wherein the pressure means comprises a threaded fastener.

8. The fixture of claim 1 wherein the pressure means comprises a gas.

9. The fixture of claim 1 wherein the pressure means comprises a liquid.

10. The fixture of claim 1 wherein $CTE1 \geqq CTE2$ and wherein the change in the gap is a decrease in the gap.

11. The fixture of claim 1 wherein $CTE1 \geqq CTE3 \geqq CTE2$.

12. A fixture for applying heat and pressure to a workpiece comprising:
   a bottom plate forming the base of the fixture;
   a first expansion block opposed to the bottom plate and comprising a first material having a first coefficient of thermal expansion, CTE1;
   a top plate opposed to the expansion block and forming the top of the fixture;
   an alignment means aligning the bottom plate and second plate and comprising a second material having a second coefficient of thermal expansion, CTE2;
   a pressure means spacing the expansion block and top plate a fixed distance apart at room temperature, the pressure means comprising a third material having a third coefficient of thermal expansion, CTE3;
   at least two additional expansion blocks and two displacement transfer means positioned between the pressure means and the bottom plate and adjacent to the first expansion block in side-by-side relation; and
   wherein, in operation, a workpiece is placed between the bottom plate and the first expansion block and pressure is applied to the workpiece by the pressure means directly on the first expansion block to keep the workpiece from moving wherein the bottom plate is separated from the first expansion block by a gap, the workpiece and fixture are then placed in an oven heated to a predetermined temperature, the heat causing the expansion blocks, alignment means and pressure means to expand with a net displacement so as to change the gap to thereby cause pressure to be applied to the workpiece while being heated wherein the net displacement includes the additive expansions of the first expansion block and the at least two additional expansion blocks transferred to the first expansion block by the displacement transfer means.

* * * * *